United States Patent

Mizuno et al.

[11] Patent Number: 6,129,046
[45] Date of Patent: Oct. 10, 2000

[54] SUBSTRATE PROCESSING APPARATUS

[75] Inventors: Shigeru Mizuno, Kanagawa-ken; Masahito Ishihara, Tokyo; Kazuhito Watanabe; Nobuyuki Takahashi, both of Kanagawa-ken, all of Japan

[73] Assignee: Anelva Corporation, Fuchu, Japan

[21] Appl. No.: 08/795,348

[22] Filed: Feb. 4, 1997

[30] Foreign Application Priority Data

Mar. 15, 1996 [JP] Japan .................................. 8-087468

[51] Int. Cl.[7] .................................................. C23C 16/00
[52] U.S. Cl. ........................................... 118/725; 118/728
[58] Field of Search ..................................... 118/725, 728

[56] References Cited

U.S. PATENT DOCUMENTS 5,230,741 7/1993 van de Ven et al. .
5,374,594 12/1994 van de Ven et al. .
5,792,304 8/1998 Tamura .................................. 118/728

FOREIGN PATENT DOCUMENTS 5-21866 4/1993 Japan .

OTHER PUBLICATIONS

Metals Handbook, 9th Ed., vol. 6, PS G5 ©1983 American Society for Metals, Metals Park, Ohio.

*Primary Examiner*—Richard Bueker
*Attorney, Agent, or Firm*—Burns, Doane, Swecker & Mathis, LLP

[57] ABSTRACT

The present invention provides a substrate processing apparatus having improved temperature distribution on a block heater and improved productivity. The substrate processing apparatus includes a reactor having an exhaust unit to form a vacuum environment therein for processing a surface of a substrate, a support member provided in the reactor, and gas introduction units for introducing reactive gases into the reactor, the substrate support member including a block heater. The block heater has upper, intermediate and lower members, which are placed one over another, the faying surfaces of the respective members being joined by diffusion bonding. A heating member is provided between the intermediate and lower members, and purge gas passages are formed between the intermediate and upper members.

11 Claims, 4 Drawing Sheets

SUBSTRATE PROCESSING APPARATUS

BACKGROUND OF THE INVENTION

1. Field of the Invention

The present invention relates to a substrate processing apparatus, and, more particularly, to a substrate processing apparatus used for film deposition processes in semiconductor fabrication, such as sputtering, chemical vapor deposition (CVD) and plasma enhanced CVD (PECVD), as well as pre-treatment processes such as substrate heating and soft etching for cleaning substrate surfaces.

2. Description of the Related Art

The integration of an integrated circuit of a semiconductor device has been now developed. Accurate reproducibility in processing from substrate to substrate and uniformity of processing within a substrate are important factors for improving productivity of highly-integrated circuits. Precise process control in various processes of substrate processing is required for achieving good reproducibility and high uniformity. More particularly, control of the substrate temperature is important for reproducibility and uniformity. For example, in an Al (aluminum) film deposition process employing a sputtering method, processing for filling fine holes with Al is performed at a temperature within the range of 400 to 500° C. In order to fill the fine holes with Al without voids, it is important to precisely set the substrate temperature and uniformly control the temperature within a substrate. In deposition of W and TiN films on a substrate by the CVD process, processing is performed within a temperature range of 300 to 600° C. Temperature control is an important factor in determining electrical characteristics of the W and TiN films and the film thickness distribution (the uniformity of film thickness) within a substrate. For a substrate having an increased diameter, for example, a 300 mm diameter, uniformity of the substrate temperature is more important for maintaining and improving yield.

A CVD apparatus as an example of conventional substrate processing apparatus is described with reference to FIG. 4. A structure similar to the structure of this conventional apparatus is disclosed in U.S. Pat. Nos. 5,230,741 and 5,374,594 (Nouvellus Lam Research Patent).

In FIG. 4, the inside of a reactor 111 is evacuated by an exhaust unit 112 and an exhaust mechanism 113, and maintained in a necessary reduced pressure state. A substrate 114 is clamped on a support member 115. The support member 115 contains a block heater 116 for holding the substrate 114 thereon so that the substrate 114 is heated to a desired temperature by the block heater 116. The block heater 116 comprises a sheathed heater 117 provided therein, which is connected to a heating control mechanism 118. On the other hand, the temperature of the block heater 116 is measured by a thermocouple 119 fixed on the surface of the block heater 116 by screws. The measurement data of the thermocouple 119 is input to the heating control mechanism 118. The temperature of the block heater 116 is controlled through the heating control mechanism 118 and the sheathed heater 117. The reactor 111 comprises a water-cooling passage 120 for suppressing a temperature rise by cooling water which flows therethrough.

Source gases are introduced into the reactor 111 through an upper gas introduction mechanism 121. CVD reaction of the source gases takes place to deposit a desired thin film on the substrate 114. The support member 115 comprises a mechanism for introducing a purge gas into a peripheral portion of the back of the substrate 114 so as to prevent film deposition on the back of the substrate 114 during film deposition. The purge gas is supplied from a purge gas supply mechanism 123. Unreacted gases, by-product gases and the purge gas are exhausted to the outside through the exhaust unit 112.

The substrate 114 is clamped on the support member 115 by a differential pressure chuck. The differential pressure chuck is achieved by the pressure difference produced between the internal pressure of the reactor 111 and the pressure on the back side of the substrate 114 during film deposition. The pressure difference is produced by exhausting air in an annular groove 126 and radial grooves 127, which are formed in the surface of the block heater 116 on which the substrate 114 is held. The air in the annular groove 126 and the radial grooves 127 is exhausted through an exhaust port 125 which is connected to a differential pressure chuck exhaust mechanism 124.

The block heater 116 comprises two plates having different thicknesses, i.e., an upper member 128 and a lower member 129. A groove is formed in at least one of the faying surfaces of the upper and lower members 128 and 129. The sheathed heater 117 is fixed to this groove. Since the upper and lower members 128 and 129 are joined by welding the contact portions in the outer and inner peripheral portions of the groove, the sheathed heater 117 is isolated from the atmosphere in the reactor 111 so as not to be exposed to reactive gases, such as the source gases. FIG. 4 shows a weld portion 130. The upper and lower members 128 and 129 can also be joined by other than welding such as by brazing or a method comprising providing a sealing material between the upper and lower members and screwing these members.

The purge gas supplied from the external purge gas supply mechanism 123 is passed through a purge gas inlet 135, a support member 136, a through passage 131 and a groove 132, and blown into the reactor 111 from the periphery of the back of the substrate 114. The blowoff of the purge gas from the back of the substrate 114 prevents adhesion of a deposit to the back of the substrate 114. The upper member 128 which constitutes the block heater 116 comprises the horizontal through passage 131 which is radially provided therein, and the vertical annular groove 132. The through passage 131 and the groove 132 are formed in the upper member 128 before the upper and lower members 128 and 129 are joined. The ends of the horizontal through passage 131 are provided with a cover 133 and sealed by a weld portion 134 so as to prevent leakage of the purge gas to the outside.

Another purge gas supplied from the purge gas supply mechanism 123 is passed through another purge gas inlet 137, the space between the block heater 116 and the bottom wall of the reactor 111, and the space between the block heater 116 and a shield 138, and blown into the reactor 111. This blowoff of the other purge gas prevents the source gases from entering the periphery of the block heater 116, thereby preventing adhesion of a deposit to the periphery of the block heater 116.

The above-mentioned conventional apparatus has the following problems. Although the sheathed heater 117 is fixed in the block heater 116 by welding the upper and lower members 128 and 129, welding easily causes thermal stress. To relax the thermal stress, heat treatment and secondary cutting must be performed after welding. This thermal stress is significantly increased as the diameter of the substrate 114 is increased, and brings about an important problem of making it difficult to obtain a uniform substrate temperature. Since the inside of the groove is not joined by welding the faying surfaces of the upper and lower members 128 and 129, spaces occur between the sheathed heater 117 and the upper and lower members 128 and 129. This causes a problem of a deterioration in the efficiency of heat transfer.

When the upper and lower members 128 and 129 are joined with a brazing material, the brazing material is exposed to the inner space of the reactor 111. This causes the problem of the brazing material evaporating and deteriorating due to the reactive gases during film deposition. As with welding, spaces occur between the sheathed heater 117 and the upper and lower members, thereby causing the same problem as described above.

When the upper and lower members 128 and 129 are joined by screwing, a problem occurs in that the screws become loosened due to temperature changes. The loosening of the screws causes the problem of easily deteriorating the sealing properties between the insides of the upper and lower members 128 and 129 and the atmosphere in the reactor 111.

Further, since the through passage 131 of the upper member 128 must be sealed by the cover 133 using welding or brazing after the through passage 131 is formed in the upper member 128 for supplying the purge gas, problems with heat stress and evaporation of the brazing material occur.

OBJECTS AND SUMMARY

An object of the present invention is to solve the above problems and provide a substrate processing apparatus which hardly produces heat stress and exhibits improved temperature distribution of a block heater.

In order to achieve the above object, in one aspect of the present invention there is provided a substrate processing apparatus comprising a block heater for keeping the temperature of a substrate constant. The block heater comprises at least two plate members placed one over another and integrated by diffusion bonding of the faying surfaces thereof, and a heating member (sheathed heater) provided between the at least two plate members. Since the at least two plate members are joined and integrated by diffusion bonding, no heat stress occurs, and neither heat treatment nor secondary cutting is required after bonding. Therefore, it is possible to obtain a uniform substrate temperature even if the diameter of a substrate is increased. In addition, since the entire faying surfaces are joined by diffusion bonding, the efficiency of heat transfer is improved.

The substrate processing apparatus further comprises a reactor provided with an exhaust unit for evacuating the inside of the reactor by an external exhaust mechanism through the exhaust unit in order to establish a vacuum environment for processing a surface of the substrate. A support member is provided in the reactor so as to hold the substrate to be processed thereon. The substrate processing apparatus further includes gas introduction means for introducing into the reactor reactive gases used for processing the surface of the substrate. The support member includes the block heater. A purge gas passage may be formed for flowing a purge gas between the at least one of two plate members and another member.

A groove for embedding the heating member is preferably formed in at least one of the faying surfaces of the at least two plate members.

It is preferable that a groove as a purge gas passage be formed in the faying surfaces of the at least two plate members, through holes as purge gas passages be formed in the at least two plate members in the depthwise direction thereof, and a passage to which a purge gas is supplied be formed in the outer side of the member of the at least two plate members on which the substrate is held.

An electrostatic chuck mechanism for clamping the substrate is preferably provided on the block heater.

In another aspect of the present invention, there is provided a substrate processing apparatus comprising at least two plate members comprising an upper member on the substrate side, an intermediate member and a lower member. The upper, intermediate and lower members are placed one over another and bonded together by diffusion bonding of the faying surfaces thereof. The substrate processing apparatus further comprises a heating member provided between the intermediate and lower members, and purge gas passages formed between the intermediate and upper members.

A groove for embedding the heating member is preferably formed in at least one of the faying surfaces of the intermediate and lower members.

It is preferable that a groove as a purge passage be formed in one of the faying surfaces of the intermediate and upper members, through holes as purge gas passages be formed in at least one of the upper, intermediate and lower members in the depthwise direction thereof, and a passage to which supplying a purge gas is supplied is formed in the outer side of the upper member.

An electrostatic chuck mechanism for clamping the substrate is preferably provided on the block heater.

DETAILED DESCRIPTION OF THE PREFERRED EMBODIMENT

A preferred embodiment of the present invention is described with reference to the attached drawings.

Figure 1:
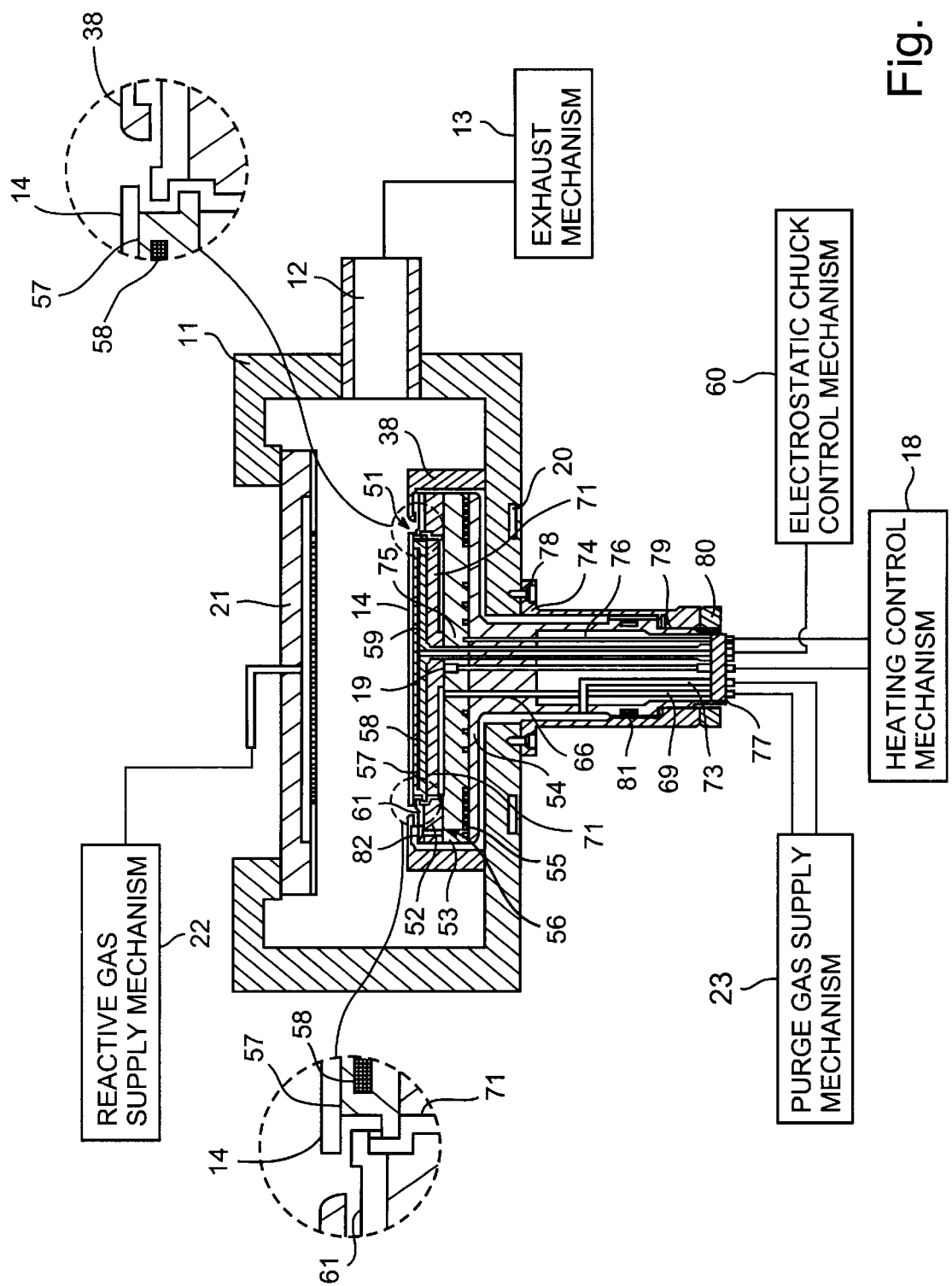
FIG. 1 is a longitudinal sectional view of a substrate processing apparatus in accordance with a preferred embodiment of the present invention.

FIG. 1 shows an exemplary embodiment of the present invention. This embodiment concerns a thin film deposition apparatus employing the CVD process as an example of a substrate processing apparatus.

The inside of a reactor 11 is evacuated by an exhaust unit 12 and an exhaust mechanism 13 and maintained in a desired vacuum state. A substrate 14 is placed on a support member 51 which is provided with a block heater 56 comprising upper, intermediate and lower members 52, 53 and 54, and a sheathed heater 55. The substrate 14 is placed on an electrostatic chuck plate 57 provided on the upper member 52, and clamped by an electrostatic chuck mechanism. The electrostatic chuck plate 57 contains an electrode 58, and is disposed so that the electrode 58 contacts a feeder line 59 exposed to the upper surface of the upper member 52. Electric power is supplied to the feeder line 59 from an external electrostatic chuck control mechanism 60.

The electrostatic chuck plate 57 comprises a disk-shaped plate having a diameter smaller than that of the substrate. The electrostatic chuck plate 57 is fixed to the upper member 52 by a press ring 61 and fixing screws 82. The press ring 61 has an inner diameter smaller than that of the substrate and an outer diameter equal to that of the upper member 52. The press ring 61 contacts the electrostatic chuck plate 57 at a plurality of discrete locations. A space having a width of about 0.5 to 1.0 mm is formed between the press ring 61 and the electrostatic chuck plate 57 so as to blow off the purge gas, such as Ar gas, for preventing film deposition on the back side of the substrate 14 from the space between the press ring 61 and the electrostatic chuck plate 57. The supply of the purge gas will be described in detail below.

When the block heater 56 is set to a desired temperature, the electrostatic chuck plate 57 is also heated. The substrate 14 placed on the electrostatic chuck plate 57 is thus also heated to a desired temperature. The temperature of the block heater 56 is measured by a thermocouple 19 fixed in the block heater 56 by welding. A heating control mechanism 18 controls the power supply to the sheathed heater 55 on the basis of the measured temperature. The sheathed heater 55 is connected to the heating control mechanism 18 through a through passage 67 (shown in FIG. 2) provided in the lower member 54. The reactor 11 is provided with a water-cooling passage 20 for suppressing a temperature rise.

Source gases are introduced from a reactive gas supply mechanism 22 through an upper gas introduction mechanism 21. A desired thin film is formed on the surface (upper side) of the substrate 14 by chemical reaction of the source gases. For example, in the case of blanket tungsten, W film deposition on the substrate 14 is carried out under the conditions that the flow rate of $H_2$ gas is 1000 to 4000 sccm, the flow rate of $WF_6$ gas is 50 to 200 sccm, the temperature of the substrate is 300 to 500° C., and the film deposition pressure is 20 to 100 Torr. Unreacted gases, by-product gases and the purge gas, which remain in the reactor 11, are exhausted through the exhaust unit 12.

As described above, the block heater 56 for heating the substrate 14 preferably comprises the three substantially plate-shaped members, i.e., the upper, intermediate and lower members 52, 53 and 54. The respective faying surfaces of the members 52, 53 and 54 are joined by diffusion bonding.

The term "diffusion bonding" means that faying surfaces are joined by heating the surfaces under application of a high compressive load. In detail, workpieces to be joined are placed in a furnace that is heated to a high temperature. The faying surfaces of the workpieces are then coalesced by atomic bonding, and joined together by being allowed to stand for a certain time while applying a high compressive load in the direction perpendicular to the faying surfaces so as not to produce deformation. In diffusion bonding, the faying surfaces are joined due to mutual diffusion of atoms between the members. The surfaces joined by diffusion bonding are thus completely joined without a space, and gastightness can sufficiently be maintained.

In this embodiment, each of the upper, intermediate and lower members 52, 53 and 54 is made of stainless steel (SUS321), and these members are joined by diffusion bonding at a temperature of 1000° C.

Grooves for providing the sheathed heater 55 are formed in at least one of the opposite surfaces of the intermediate and lower members 53 and 54. In this embodiment, the grooves are formed on the bottom surface of the intermediate member 53.

Figure 2:
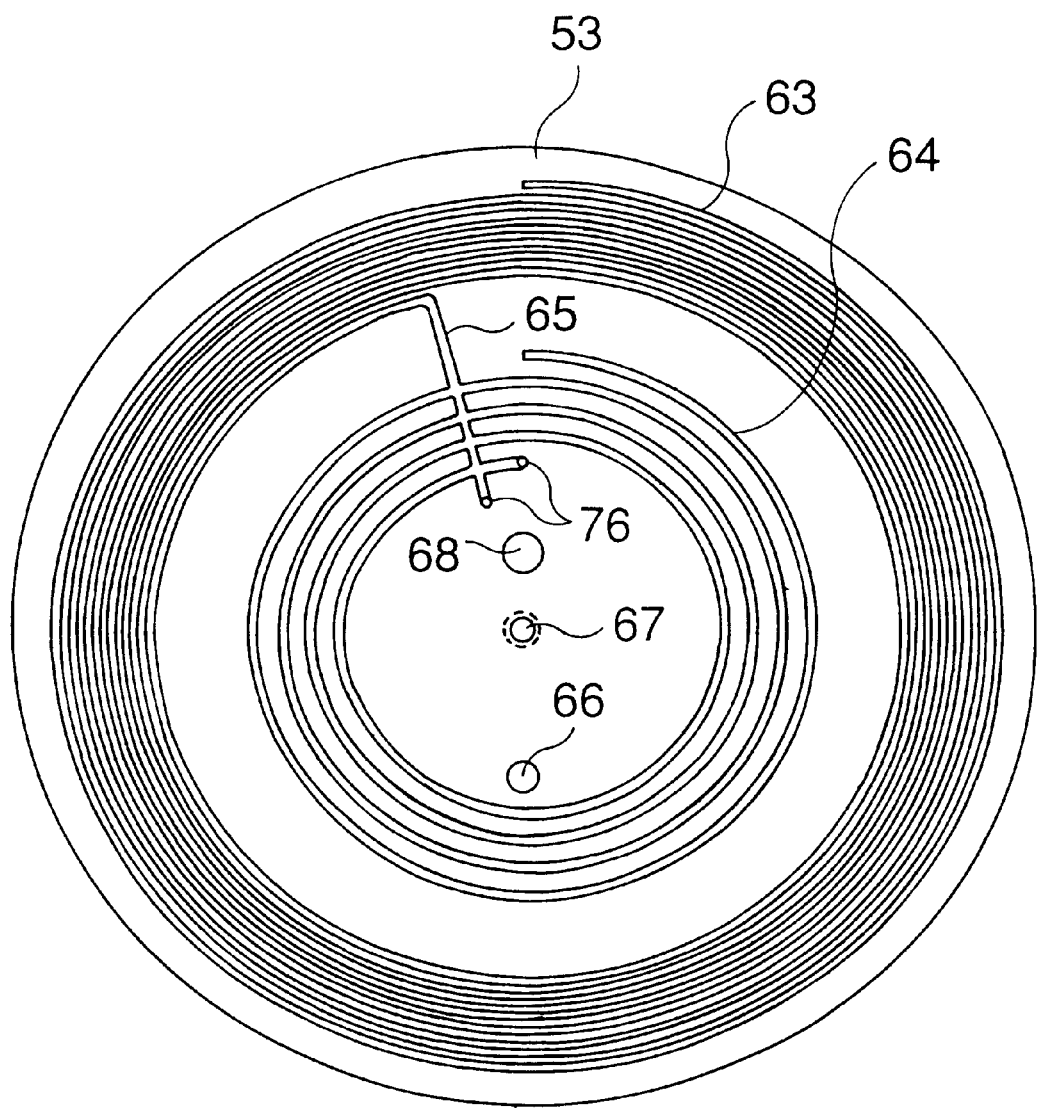
FIG. 2. is a bottom view of an intermediate member.

FIG. 2 is a bottom view of the intermediate member 53. In FIG. 2, grooves 63 and 64 for fixing the sheathed heater 55 are formed in the intermediate member 53. Both the grooves 63 and 64 preferably have a spiral form. The groove 63 is formed in the outer peripheral portion with spiral turns at relatively small intervals. The groove 64 is formed in the central portion with spiral turns at relatively large intervals.

Such arrangement of the grooves 63 and 64 indicates that the sheathed heaters 55 are provided in two portions, i.e., the outer peripheral side and the inner peripheral side. The two portions are preferably controlled independently by respective power sources so as to facilitate control of the uniformity of the temperature.

The spiral grooves 63 and 64 are connected by a radial groove 65 which is formed with a depth larger than the other grooves 63 and 64 so that, in fact, the sheathed heater wires respectively provided in the grooves 63 and 64 do not make contact electrically. FIG. 2 shows a purge gas through passage 66, a thermocouple through passage 67 and a sheath through passage 68 for the electrostatic chuck feeder line, which will be described below.

A passage for supplying a purge gas to the top portion of the block heater is formed in the block heater 56 so as to prevent film deposition on the back side of the substrate 14.

Figure 3:
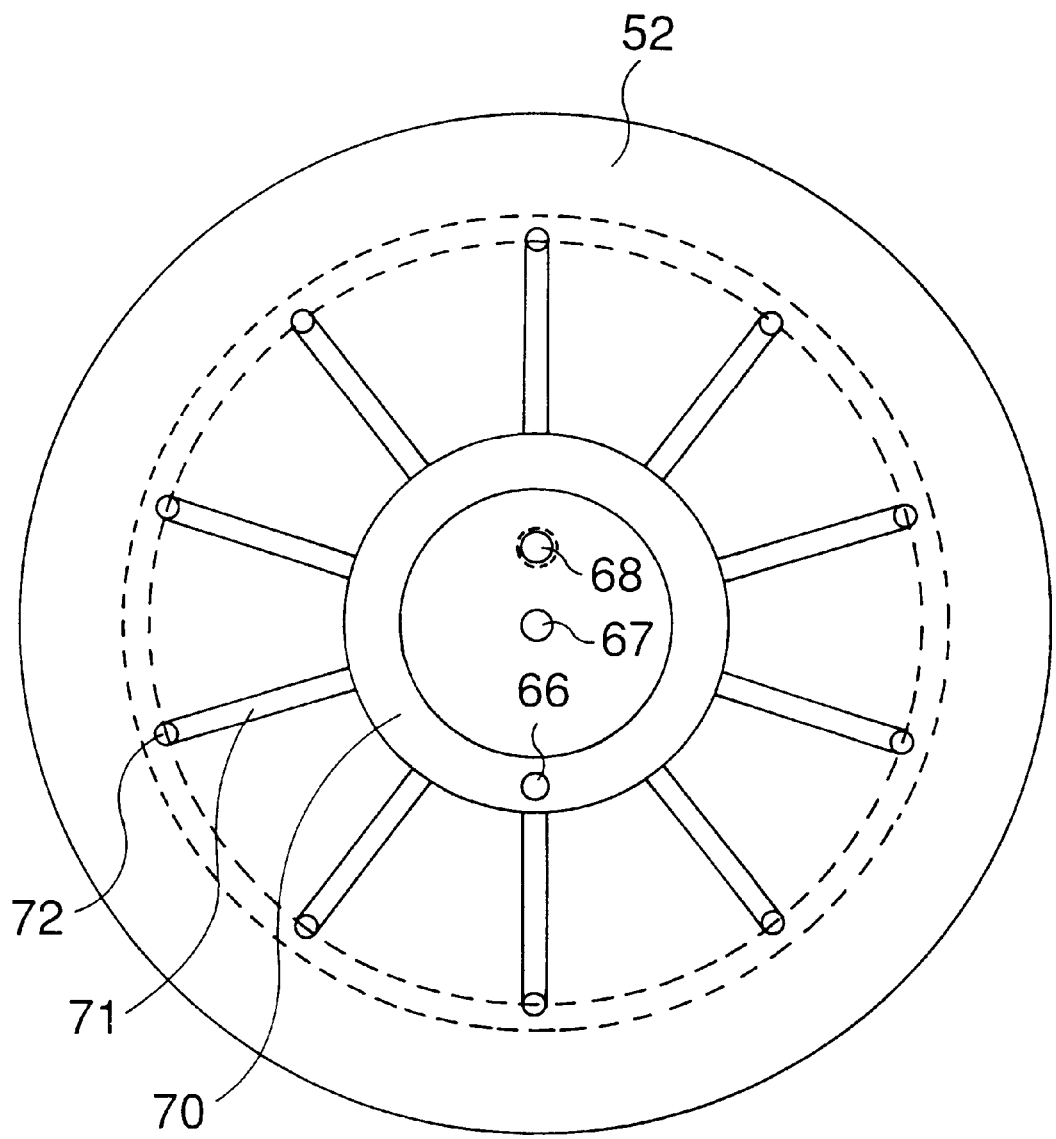
FIG. 3. is a bottom view of an upper member.
Figure 4:
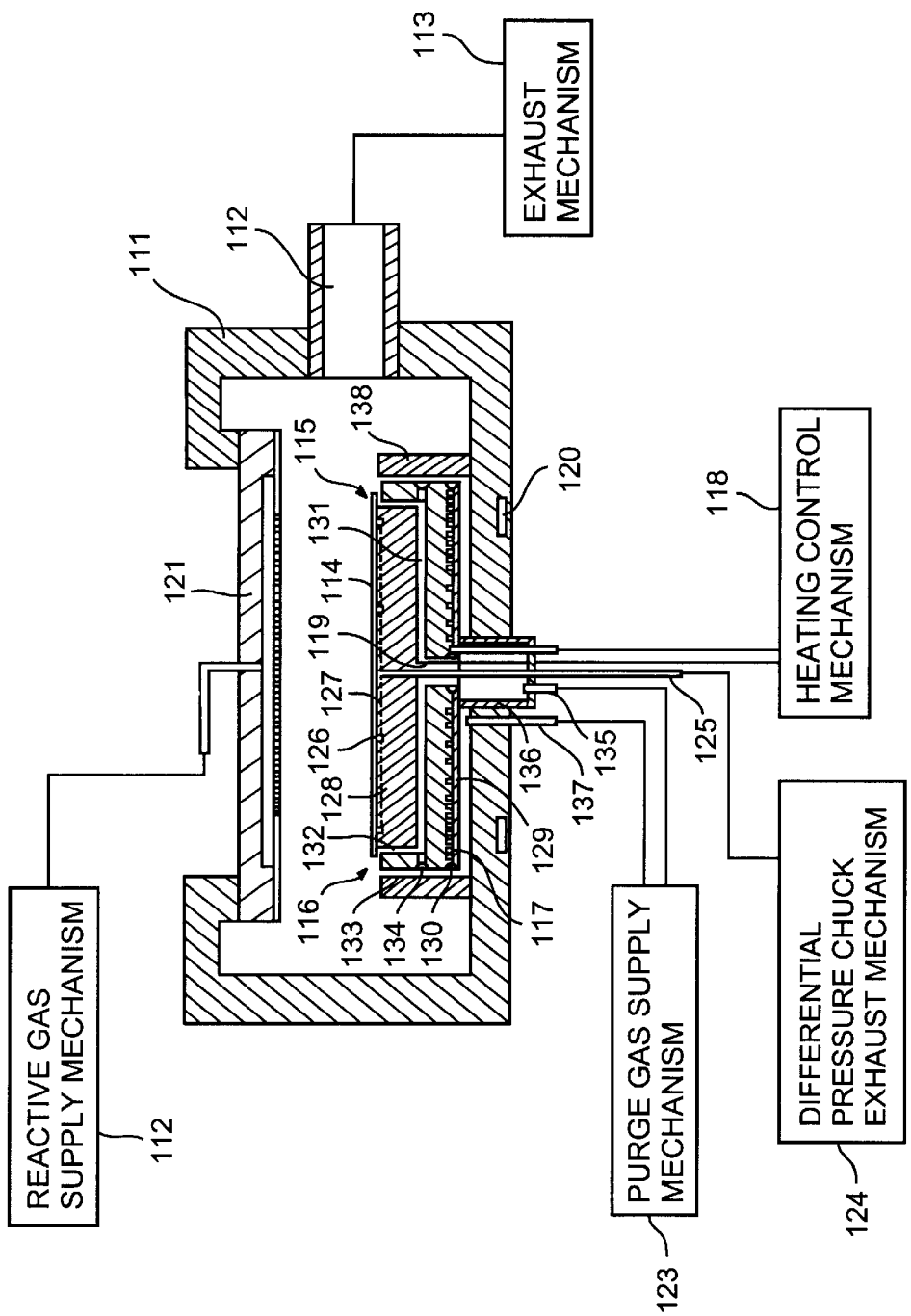
FIG. 4 is a longitudinal sectional view of a conventional substrate processing apparatus.

FIG. 3 is a bottom view of the upper member 52, illustrating the arrangement of the purge supply passages. As shown in FIG. 1, the purge gas is introduced into a first purge gas pipe 69 from the external purge gas supply mechanism 23. The purge gas is passed through the through passage 66 formed in the lower and intermediate members 54 and 53. The purge gas is supplied to a plurality of radial grooves 71 from an annular groove 70 formed in the lower side of the upper member 52 near the center thereof. The purge gas is further supplied to the space between the electrostatic chuck plate 57 and the press ring 61 through passages 72. Since the through passages 66 and 72, and the grooves 70 and 71 are formed before the members 52, 53 and 54 are joined together, there is no through hole which must be sealed, unlike a conventional example.

Additional purge gas is introduced into a second purge gas pipe 73 from the purge gas supply mechanism 23. The additional purge gas is passed through the space between the lower member 54 and a support member 74, the space between the lower member 54 and the bottom wall of the reactor 11, and then the space between a shield 38 and the side of the block heater 56. The purge gas is blown into the reactor 11 from the space between the upper wall of the shield 38 and the press plate 61. This flow of the purge gas prevents reactive gases from entering the space between the shield 38 and the block heater 56. It is thus possible to prevent film adhesion to the surface of the block heater 56.

Since the thermocouple 19 is provided, the through passage 67 having a shape corresponding to the thermocouple 19 is formed in the lower and intermediate members 54 and 53. In this embodiment, the thermocouple 19 comprises a sheathed thermocouple having a thick end so as to sufficiently contact the upper member 52. The thermocouple 19 is previously fixed to the intermediate member 53 by welding.

The through passage 68 is formed in the upper, intermediate and lower members 52, 53 and 54 so as to provide the feeder line 59 for the electrode 58 of the electrostatic chuck plate 57. In order to prevent electrical contact between the feeder line 59 and the members 52, 53 and 54, a sheath 75 is provided in each of the members so that the feeder line 59 is passed through the sheaths 75. The upper end of the sheaths 75 is connected to the upper member 52 by welding, and the sheaths are filled with an insulator so as to maintain electrical insulation of the feeder line 59 from the sheaths 75. At the same time, the sheaths 75 maintain gastightness of the inner side thereof.

The purge gas pipes 69 and 73, the thermocouple 19, the feeder line for the sheathed heater 55 and the feeder line 59

(the sheaths 75) for the electrostatic chuck plate 57 are fixed by a fixing plate 77 provided at the lower end of the lower member 54.

The block heater 56 is disposed on the support member 74 fixed to the reactor 11 by screws 78. The lower cylindrical portion of the lower member 54 contacts the support member 74 with an O ring 79 therebetween, and a turning screw 80 engages the threaded portion at the lowermost end of the lower member 54. The block heater 56 is vertically pulled downward by tightening the turning screw 80 to seal the inner side due to the O ring 79 and to stably maintain the block heater 56 vertically. A water-cooling passage 81 is provided in the lower cylindrical portion so as to prevent heat damage to the O ring 79.

In the block heater 56, heat transfer between the sheathed heater 55 and the members which constitute the block heater 56, and between the respective members 52 to 54, is improved. Controllability of temperature distribution is improved, as compared with a conventional block heater.

The maximum heating temperature is 700° C., and the rate of temperature rise is about twice as high as a conventional block heater with the same input power. Although, in a conventional apparatus, a temperature distribution within ±7° C. is obtained on the substrate, this embodiment exhibits good temperature distribution within ±3° C. Important factors for good temperature distribution on the substrate are not only fine power control and heat transfer of the sheathed heater but also the stable contact between the electrostatic chuck plate 57 and the upper member 52, which is caused by less thermal stress of the block heater 56 itself.

The diffusion bonding is performed by heating at 1000° C. or more, and thus has an annealing effect. The annealing effect renders unnecessary the secondary cutting work required in conventional welding junction between members and the work of removing stress caused by heat treatment. As a result, the time required for producing the block heater 56 is reduced to half the time for a conventional block heater.

Since the diffusion bonding is performed after the grooves and the through passages have been previously formed in the upper, intermediate and lower members 52, 53 and 54, the grooves and the through passages can easily be formed in the block heater. Although, in a conventional block heater, the through holes of the block heater must be covered and then sealed by welding after the through passages are formed, this embodiment does not require the process for welding for sealing the holes, as well as the process for removing the stress caused by welding. Since the block heater produced by diffusion bonding need not be subjected to such secondary processing, a part, such as the thermocouple, which is conventionally fixed by screwing can be fixed by welding, thereby improving reliability.

In addition, the block heater 56 can be easily removed vertically by removing the shield 38 and the turning screw 80. Such removal of the block heater 56 can significantly improve the maintenance of the block heater 56.

The block heater in accordance with this embodiment can be applied to not only the CVD apparatus but also to film deposition apparatus such as a sputtering apparatus and PECVD apparatus, and substrate processing apparatus employing heat treatment and soft etching.

As seen from the above description, the block heater of the present invention comprises at least two members which are integrally joined by diffusion bonding, and thus hardly produces thermal stress and has good temperature distribution. Since the necessary passages and grooves are previously formed in the surfaces of the members before the members are joined by diffusion bonding, the required passages can easily be formed, thereby simplifying the production process.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A substrate processing apparatus comprising:

a reactor provided with an exhaust unit for evacuating the inside thereof to form a vacuum environment for processing a surface of a substrate;

a substrate support member provided in the reactor for holding the substrate thereon, the substrate support member including a block heater for heating the substrate;

gas introduction means for introducing reactive gases used for processing the surface into the reactor;

the block heater comprises at least an upper layer, an intermediate layer and a lower layer, which layers have faying surfaces which are adjacent one another and integrated together by diffusion bonding of the faying surfaces thereof;

said block heater further including first grooves for a purge gas between the upper layer and the intermediate layer and second grooves between the intermediate layer and the lower layer; and a heating member arranged in the second grooves.

2. A substrate processing apparatus according to claim 1, wherein a through hole as a purge gas passage is formed in the layers in a depthwise direction thereof, and a passage to which a purge gas is supplied is formed in an outside of the layers on which the substrate is held.

3. A substrate processing apparatus according to claim 1, wherein an electrostatic chuck mechanism for clamping the substrate is provided on the block heater.

4. A substrate processing apparatus according to claim 1, wherein the layers are placed one over another.

5. A substrate processing apparatus according to claim 4, wherein a groove for embedding the heating member is formed in at least one of the faying surfaces of the intermediate and lower layers.

6. A substrate processing apparatus according to claim 4, wherein the first groove is formed in one of the faying surfaces of the intermediate and upper layers to form a purge gas passage, a through hole as a purge gas passage is formed in at least one of the upper, intermediate and lower layers in the depthwise direction thereof, and a passage to which a purge gas is supplied is formed in the outside of the upper layer.

7. A substrate processing apparatus according to claim 4, wherein an electrostatic chuck mechanism for holding the substrate is provided on the heater.

8. A substrate processing apparatus according to claim 1, wherein the at least three layers are stainless steel.

9. A substrate processing apparatus according to claim 1, wherein the first grooves are arranged radially.

10. A substrate processing apparatus according to claim 9, wherein the second grooves are arranged spirally.

11. A substrate processing apparatus according to claim 1, wherein the second grooves are arranged spirally.

* * * * *